(12) United States Patent
Jia et al.

(10) Patent No.: US 9,488,873 B2
(45) Date of Patent: Nov. 8, 2016

(54) SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Pijian Jia, Beijing (CN); Xu Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/497,618

(22) Filed: Sep. 26, 2014

(65) Prior Publication Data
US 2015/0325592 A1    Nov. 12, 2015

(30) Foreign Application Priority Data

May 8, 2014    (CN) .......................... 2014 1 0194168

(51) Int. Cl.
*H01L 27/12* (2006.01)
*G02F 1/1339* (2006.01)
*G02F 1/1368* (2006.01)
(Continued)

(52) U.S. Cl.
CPC ......... *G02F 1/13394* (2013.01); *G02F 1/1339* (2013.01); *G02F 1/1368* (2013.01); *G02F 1/133512* (2013.01); *G02F 1/136286* (2013.01); *H01L 27/124* (2013.01); *G02F 1/133514* (2013.01); *G02F 2001/13398* (2013.01)

(58) Field of Classification Search
CPC .................. H01L 2924/00; H01L 2924/0002; H01L 2224/48247; H01L 2224/48465; H01L 27/153; H01L 27/322; H01L 27/3246; H01L 27/3248; H01L 27/325
See application file for complete search history.

(56) References Cited

U.S. PATENT DOCUMENTS 7,570,338 B2 *    8/2009  Yoon .................... G02F 1/13394
                                                       349/155
9,250,479 B2 *    2/2016  Tomioka ............. G02F 1/13394
(Continued)

FOREIGN PATENT DOCUMENTS

CN        1693977 A        11/2005
CN        1881015 A        12/2006
(Continued)

OTHER PUBLICATIONS

First Office Action regarding Chinese application No. 201410194168.0, dated Mar. 17, 2016. Translation provided by Dragon Intellectual Property Law Firm.
(Continued)

*Primary Examiner* — Tony Tran
(74) *Attorney, Agent, or Firm* — Harness, Dickey & Pierce, P.L.C.

(57) ABSTRACT

The present disclosure provides a substrate and a display device. The substrate is an array substrate or a color filter substrate of a display panel. The substrate includes at least one spacer-supporting region. The spacer-supporting region includes a recess configured to support a spacer. By the presence of the recess configured to support a spacer in the spacer-supporting region, an upper of the spacer abuts within the recess. When the display panel is squeezed, the upper of the spacer does not move, thereby ensuring a uniform cell gap of the display panel and improving quality of products.

7 Claims, 2 Drawing Sheets

(51) Int. Cl.
*G02F 1/1362* (2006.01)
*G02F 1/1335* (2006.01)

(56) References Cited

U.S. PATENT DOCUMENTS

2005/0099579 A1 5/2005 Yoo et al.
2010/0271327 A1* 10/2010 Shin .................... G02F 1/13338
    345/174
2013/0342782 A1* 12/2013 Kim .................... G02F 1/13394
    349/46

FOREIGN PATENT DOCUMENTS

CN     202033558 U    11/2011
JP     2013127563 A   6/2013

OTHER PUBLICATIONS

Second Office Action regarding Chinese Application No. 201410194168.0 dated Jul. 15, 2016. Translation provided by Dragon Intellectual Property Law Firm.

* cited by examiner

SUBSTRATE AND DISPLAY DEVICE

CROSS-REFERENCE TO RELATED APPLICATION

This application claims priority to Chinese Patent Application No. 201410194168.0 filed on May 8, 2014, the disclosures of which are incorporated in their entirety by reference herein.

TECHNICAL FIELD

The present disclosure relates to the field of liquid crystal display technology, and more particularly to a substrate and a display device.

BACKGROUND

Thin Film Transistor-Liquid Crystal Displays (TFT-LCDs) having features such as small size, low power consumption, no radiation, etc., have been developed rapidly in recent years and have dominated the current flat panel display market. A main structure of a liquid crystal display is a liquid crystal panel. During a process of manufacturing the liquid crystal panel, design and control of a cell gap is one of key technologies of liquid crystal displays, and may directly affect quality of the liquid crystal displays.

A liquid crystal display panel includes an array substrate and a color filter substrate that are oppositely arranged to form a cell, and a liquid crystal layer filled between the array substrate and the color filter substrate. There are data lines, gate lines, and a plurality of pixel units defined by the data lines and the gate lines. Each of the pixel units includes a thin film transistor (TFT) and a pixel electrode. A first liquid crystal alignment layer is coated on the array substrate. The color filter substrate includes a color filter, a black matrix and a second liquid crystal alignment layer coated on the color filter substrate. The black matrix corresponds to positions of the data lines and the gate lines, and defines sub-pixel units. A thickness of the liquid crystal layer (i.e., cell gap) is mainly controlled by spacers disposed between the array substrate and the color filter substrate.

A spacer may be made of polymer having elasticity. The spacers may be formed on the array substrate or the color filter substrate, and are located in regions where the black matrix is located. For example, when the spacers are formed on the color substrate, spacer-supporting regions are formed in the array substrate, and upper parts of the spacers abut on corresponding spacer-supporting regions of the array substrate. The spacer-supporting regions are usually formed in the data lines. Such a structure has disadvantages that when the panel is squeezed, the upper parts of the spacers may move and uniformity of the cell gap of the panel may be changed accordingly, resulting in uneven brightness of the liquid crystal panel.

SUMMARY

One embodiment of the present disclosure provides a substrate to solve the problem in the prior art that when the panel is squeezed, the upper part of the spacer may move and uniformity of the cell gap of the panel may be changed accordingly, resulting in uneven brightness of the liquid crystal panel.

One embodiment of the present disclosure further provides a display device including the above substrate which can improve product quality.

In order to solve the above technical problem, one embodiment of the present disclosure provides a substrate including at least one spacer-supporting region; wherein the spacer-supporting region includes a recess configured to support a spacer.

Optionally, the recess includes a projection formed on a bottom of the recess; a height of the projection is smaller than a depth of the recess.

Optionally, the substrate is an array substrate.

Optionally, the substrate is a thin film transistor array substrate; the spacer-supporting region is located on a gate line.

Optionally, the spacer-supporting region includes a gate-insulating-layer-supporting-region, an active-layer-supporting-region and a source-drain-metal-layer-supporting-region.

Optionally, the recess extends to the gate line; the projection includes a gate insulating layer and an active layer.

Optionally, the substrate is a color filter substrate; the substrate includes a black matrix and a color film layer including N filter units, where N is an integral; the spacer-supporting region is located on the black matrix.

Optionally, the spacer-supporting region is formed of films which are used to form the N filter units; the recess extends to the black matrix; the projection includes films which are used to form N-n color filter units, where n is an integral, $1 \leq n < N$.

One embodiment of the present disclosure further provides a display device including the above substrate.

Optionally, the display device is a liquid crystal display panel or a liquid crystal display device.

One embodiment of the present disclosure further provides a display device including a first substrate, a second substrate and at least one spacer; wherein the first substrate includes at least one spacer-supporting region; the spacer-supporting region includes a recess; the second substrate faces the first substrate; the spacer is disposed between the first substrate and the second substrate; the spacer includes a first end located in the recess, and a second end arranged on the second substrate; the first end and the second end are two opposite ends of the spacer.

Optionally, the spacer-supporting region further includes a projection; the projection is located in the recess; the first end is located in the recess and abuts on the projection from a direction from the first substrate to the second substrate.

Optionally, the first substrate is an array substrate; the array substrate includes at least one gate line; the projection is directly formed on the gate line and located within the recess.

Optionally, a height of the projection relative to the gate line is smaller than a depth of the recess relative to the gate line.

Optionally, the spacer-supporting region includes a gate-insulating-layer-supporting-region, an active-layer-supporting-region and a source-drain-metal-layer-supporting-region which are located on the gate line; the recess is enclosed by the gate-insulating-layer-supporting-region, the active-layer-supporting-region and the source-drain-metal-layer-supporting-region; the gate-insulating-layer-supporting-region, the active-layer-supporting-region and the source-drain-metal-layer-supporting-region are stacked on each other.

Optionally, the projection includes a gate insulating layer and an active layer; the gate insulating layer and the active layer are stacked on the gate line.

Optionally, the first substrate is a color filter substrate; the color filter substrate includes a black matrix; the projection is directly located on the black matrix and located within the recess.

Optionally, a height of the projection relative to the black matrix is smaller than a depth of the recess relative to the black matrix.

Optionally, the color filter substrate further includes a color film layer including N filter units, where N is an integral; the spacer-supporting region is formed of films which are used to form the N filter units; the projection includes films which are used to form N-n color filter units, where n is an integral, $1 \le n < N$.

Optionally, the first substrate includes a plurality of spacer-supporting regions; the display device includes a plurality of spacers; the spacers are corresponding to the spacer-supporting regions in a one to one manner.

Benefit effects of the above technical solutions of the present disclosure are as follows.

In the above technical solution, the spacer-supporting region is formed on one substrate of the display panel, the recess configured to support the spacer is formed in the recess and the upper of the spacer abuts within the recess, thus, when the display panel is squeezed, the upper of the spacer does not move, thereby ensuring a uniform cell gap of the display panel and improving quality of products.

BRIEF DESCRIPTION OF THE DRAWINGS

In order to illustrate technical solutions according to embodiments of the present disclosure or in the prior art more clearly, drawings to be used in the description of the prior art or the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

A main structure of a liquid crystal display panel includes an array substrate and a color filter substrate that are oppositely arranged to form a cell. A cell gap of the panel is maintained by spacers disposed between the array substrate and the color filter substrate. The spacers may be formed on the array substrate or the color filter substrate, and spacer-supporting regions are formed in the other one of the array substrate and the color filter substrate. Upper parts of the spacers abut on the spacer-supporting regions. Such a structure has disadvantages that when the panel is squeezed, the upper parts of the spacers may move and uniformity of the cell gap of the panel may be changed accordingly, resulting in uneven brightness of the liquid crystal panel.

In order to solve the above technical problem, one embodiment of the present disclosure provides a substrate. The substrate may be an array substrate or a color filter substrate of a liquid crystal display panel. The substrate includes at least one spacer-supporting region. The spacer-supporting region includes a recess configured to support a spacer. An upper of the spacer abuts within the recess. When the display panel is squeezed, the upper of the spacer is blocked by walls of the recess and does not move. This may ensure a uniform cell gap of the display panel and improve quality of products.

Optionally, a projection is formed on a bottom of the recess, and the upper part of the spacer abuts on the projection. A height of the projection is smaller than a depth of the recess, so that when the display panel is squeezed, the upper of the spacer is blocked by the walls of the recess and does not move. The presence of the projection on the bottom of the recess may ensure that a length of the spacer used for maintaining the cell gap of the panel may satisfy requirements. Under the condition of same cell gap, the presence of the projection on the bottom of the recess may shorten the length of the spacer, thereby reducing material and cost.

In the above technical solution, the spacer-supporting region is formed on one substrate of the display panel, the recess configured to support the spacer is formed in the recess and the upper of the spacer abuts within the recess, thus, when the display panel is squeezed, the upper of the spacer does not move, thereby ensuring a uniform cell gap of the display panel and improving quality of products.

Implementation of the present disclosure will be described in details hereinafter in conjunction with the accompanying drawings and embodiments of the present disclosure. The following embodiments are presented for illustrative purposes and may not be used to limit the scope of the present disclosure.

First Embodiment

Figure 1:
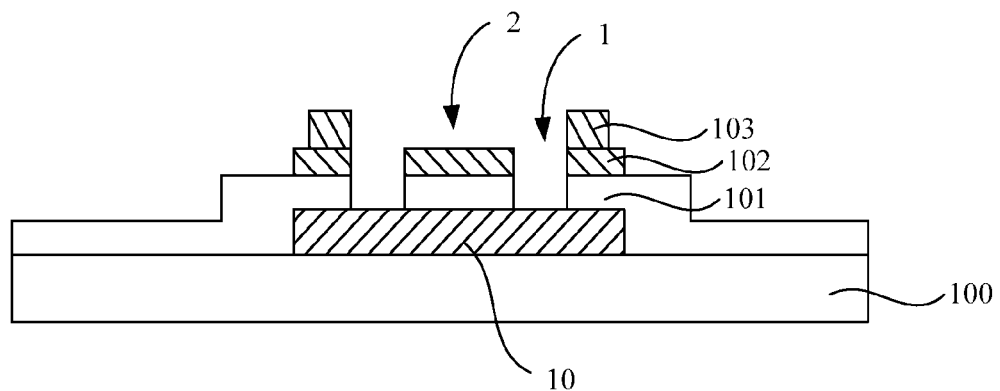
FIG. 1 is a schematic diagram showing a structure of a thin film transistor array substrate according to one embodiment of the present disclosure.

FIG. 1 is a schematic diagram showing a structure of a thin film transistor array substrate according to one embodiment of the present disclosure. In one embodiment of the present disclosure, a substrate is an array substrate of a liquid crystal display panel; that is, a spacer configured to maintain a cell gap of the display panel is formed on a color filter substrate, and a spacer-supporting region configured to support the spacer is formed on the array substrate.

Further, as shown in FIG. 1, when the substrate is the thin film transistor array substrate, the substrate includes a base substrate 100, such as a glass substrate, a quartz substrate, or other transparent substrates. The base substrate 100 includes a plurality gate lines 10 and data lines (not shown) which are vertically and horizontally distributed in cross, as well as a plurality of pixel units (not shown) defined by the gate lines 10 and the data lines. Each of the pixel units includes a thin film transistor (TFT). The TFT includes a gate electrode, a source electrode, a drain electrode and a channel located between the source electrode and the drain electrode. The gate lines 10 and the gate electrodes of the thin film transistor array substrate are made of the same gate metal such as Cu, Al, Ag, Mo, Cr, Nd, Ni, Mn, Ti, Ta, W, or alloys of these metals. The data lines, the source electrodes and the drain electrodes are made of the same source-drain metal such as Cu, Al, Ag, Mo, Cr, Nd, Ni, Mn, Ti, Ta, W, or alloys of these metals. The channel of the TFT is made from an active layer such as silicon semiconductor or metal oxide semiconductor.

The thin film transistor array substrate includes at least one spacer-supporting region. The spacer-supporting region includes a recess 1 configured to support a spacer. A projection 2 is formed on a bottom of the recess 1. A height of the projection 2 is smaller than a depth of the recess 1. An upper part of the spacer abuts on the projection 2. When the display panel is squeezed, the upper part of the spacer is blocked by walls of the recess 1 and does not move, thereby ensuring a uniform cell gap of the display panel and improving quality of products.

The spacer-supporting region may be located on the gate line 10, as shown in FIG. 1. Specifically, the spacer-supporting region includes a gate-insulating-layer-supporting-region 101, an active-layer-supporting-region 102 and a source-drain-metal-layer-supporting-region 103.

In one embodiment, the recess 1 of the spacer-supporting region extends to the gate line 10 to expose the gate line 10. The projection 2 includes a gate insulating layer and an active layer. A height of the projection 2 is smaller than a depth of the recess. Under the condition of same cell gap, a length of the spacer used for maintaining the cell gap of the panel may shorten a sum of a thickness of the gate insulating layer and a thickness of an active layer, thereby reducing materials and cost.

Second Embodiment

In one embodiment of the present disclosure, a substrate is a color filter substrate; that is, a spacer configured to maintain a cell gap of a display panel is formed on an array substrate, and a spacer-supporting region configured to support the spacer is formed on the color filter substrate.

Figure 2:
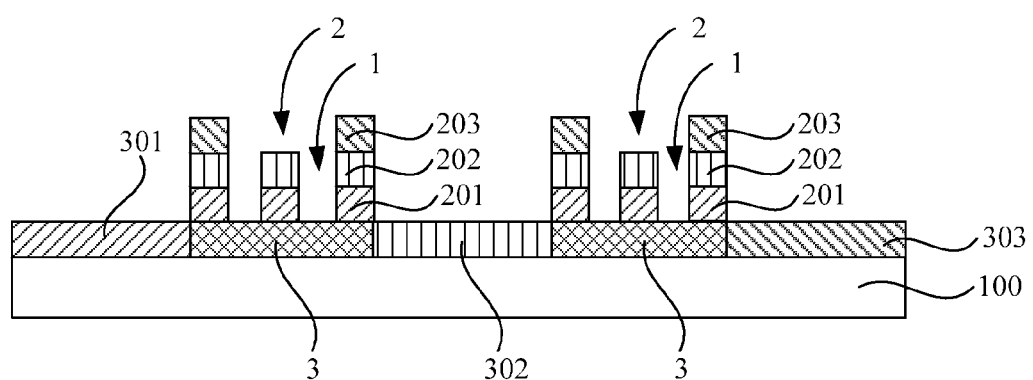
FIG. 2 is a schematic diagram showing a structure of a color filter substrate according to one embodiment of the present disclosure.

FIG. 2 is a schematic diagram showing a structure of a color filter substrate according to one embodiment of the present disclosure.

As shown in FIG. 2, the substrate includes a black matrix 3 and a color film layer including N filter units (N is an integral and usually not smaller than 3). The filter units may allow light of different colors to pass, respectively, for example, a red filter unit 301, a green filter unit 302 and a blue filter unit 303. The red filter unit 301 may be made of a red resin film. The green filter unit 302 may be made of a green resin film. The blue filter unit 303 may be made of a blue resin film. It should be noted, the color filter substrate is not limited to only include the red filter unit 301, the green filter unit 302 and the blue filter unit 303, and may further include a white filter unit, a yellow filter unit, etc.

The spacer-supporting region may be located on the black matrix 3, and may be formed of films which are used to form the N filter units. For example, the spacer-supporting region may include a red resin film supporting region 201, a green resin film supporting region 202 and a blue resin film supporting region 203.

The spacer-supporting region includes a recess 1 configured to support a spacer. An upper part of the spacer abuts within the recess 1 so that when the display panel is squeezed, the upper part of the spacer is blocked by walls of the recess 1 and does not move, and this may ensure a uniform cell gap of the display panel and improve quality of products.

Further, a projection 2 is formed on a bottom of the recess 1. A height of the projection 2 is smaller than a depth of the recess 1. Under the condition of same cell gap, the presence of the projection 2 on the bottom of the recess 1 may shorten the length of the spacer used for maintaining the cell gap of the panel, thereby reducing material and cost.

Specifically, the recess 1 extends to the black matrix 3 to expose the black matrix 3. The projection 2 includes films which are used to form the N-n color filter units, where n is an integral, 1≤n<N. A height of the projection 2 is smaller than a depth of the recess 1. When the spacer-supporting region includes the red resin film supporting region 201, the green resin film supporting region 202 and the blue resin film supporting region 203, the projection 2 may include a red resin film and a green resin film.

Third Embodiment

One embodiment of the present disclosure further provides a display device, which includes the substrate of the first embodiment or the second embodiment.

The substrate includes at least one spacer-supporting region. The spacer-supporting region includes a recess configured to support a spacer. An upper part of the spacer abuts within the recess so that when the display panel is squeezed, the upper part of the spacer does not move, and this may ensure a uniform cell gap of the display panel and improve quality of products.

The display device may be a liquid crystal display panel, or a liquid crystal display apparatus.

Figure 3:
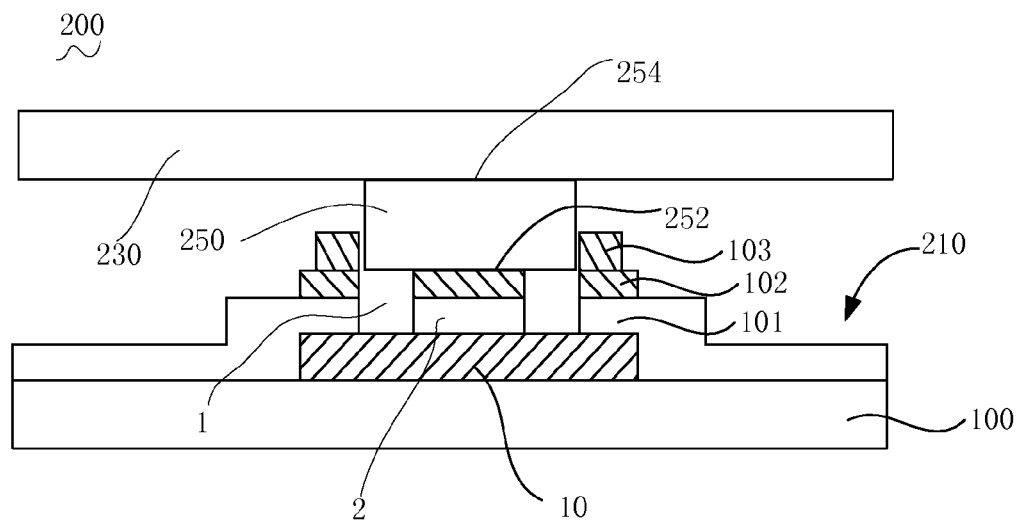
FIG. 3 is a schematic diagram showing a structure of a display device according to one embodiment of the present disclosure.

Structures of the substrate are similar to those of the above embodiment, and will not be repeated here. Further, structures of other parts of the liquid crystal display device may refer to the existing technology and will not be repeated here. The liquid crystal display device may be a digital photo frame, a mobile phone, a tablet PC, or any other product or component having displaying function. Specifically, as shown in FIG. 3, a display device 200 according to one embodiment of the present disclosure includes a first substrate 210, a second substrate 230 and a spacer 250.

The first substrate 210 may adopt structures shown in FIG. 1, which will not be repeated here.

The second substrate 230 faces the first substrate 210.

The spacer 250 is disposed between the first substrate 210 and the second substrate 230. The spacer 250 includes a first end 252 located in the recess 1, and a second end 254 arranged on the second substrate 230. The first end 252 and the second end 254 are two opposite ends of the spacer 250.

In the embodiment shown in FIG. 3, the first substrate 210 is an array substrate; the projection 2 is directly formed on the gate line 10 of the array substrate and located within the recess 1.

Figure 4:
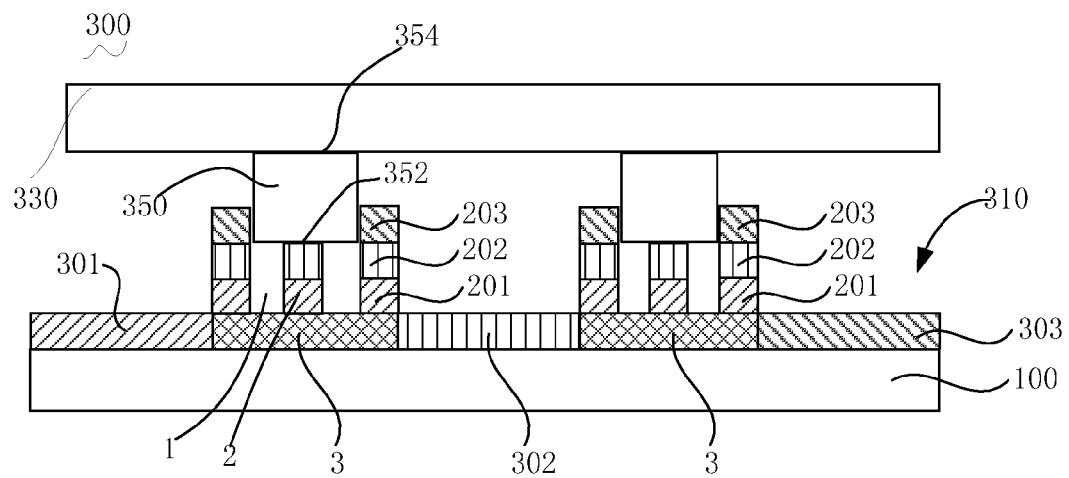
FIG. 4 is a schematic diagram showing a structure of a display device according to another embodiment of the present disclosure.

FIG. 4 is a schematic diagram showing a structure of a display device according to another embodiment of the present disclosure. As shown in FIG. 4, a display device 300 according to one embodiment of the present disclosure includes a first substrate 310, a second substrate 330 and a spacer 350.

The first substrate 310 may adopt structures shown in FIG. 2, which will not be repeated here.

The second substrate 330 faces the first substrate 310.

The spacer 350 is disposed between the first substrate 310 and the second substrate 330. The spacer 350 includes a first end 352 located in a recess 1, and a second end 354 arranged on the second substrate 330. The first end 352 and the second end 354 are two opposite ends of the spacer 350.

In the embodiment shown in FIG. 4, the first substrate 310 is a color filter substrate; the projection 2 is directly formed on the black matrix 3 of the color filter substrate and located within the recess 1.

In the technical solution of the present disclosure, the spacer-supporting region is formed in one substrate of the display panel and includes the recess configured to support the spacer, and the upper part of the spacer abut within the recess so that when the display panel is pressed, the upper part of the spacer does not move, and this may ensure a uniform cell gap of the display panel and improve quality of products.

The foregoing are merely exemplary embodiments of the present disclosure. It should be appreciated that, a person skilled in the art may make further modifications and improvements without departing from the scope of the present disclosure, and these modifications and improvements should also be considered as within the scope of the present disclosure.

What is claimed is:

1. A substrate comprising at least one spacer-supporting region;
   wherein the spacer-supporting region comprises a recess configured to support a spacer,
   wherein the recess is depressed from an outer surface of the substrate towards an inner side of the substrate,
   wherein the substrate includes a projection located within the recess; wherein a height of the projection is smaller than a depth of the recess,
   wherein the substrate is a color filter substrate; the substrate comprises a black matrix and a color film layer including N filter units, where N is an integral; the spacer-supporting region is located on the black matrix,
   wherein the spacer-supporting region is formed of films which are used to form the N filter units, and
   wherein the recess extends to the black matrix; the projection comprises films which are used to form N-n color filter units, where n is an integral, $1 \leq n < N$;
   wherein the spacer-supporting region is defined and enclosed by a red resin film, a green resin film and a blue resin film; the red resin film, the green resin film and the blue resin film are stacked on each other; the projection comprises a red resin film and a green resin film stacked on the red resin film;
   wherein the red resin film of the projection is separated from the red resin film which defines and encloses the spacer-supporting region; the green resin film of the projection is separated from the green resin film which defines and encloses the spacer-supporting region; and
   wherein the red resin film of the projection and the red resin film which defines and encloses the spacer-supporting region are in an identical layer.

2. A display device comprising a substrate according to claim 1.

3. The display device according to claim 2, wherein the display device is a liquid crystal display panel or a liquid crystal display device.

4. The substrate according to claim 1, wherein the green resin film of the projection and the green resin film which defines and encloses the spacer-supporting region are in an identical layer.

5. A display device comprising a first substrate, a second substrate and at least one spacer;
   wherein:
   the first substrate comprises at least one spacer-supporting region; the spacer-supporting region comprises a recess;
   the recess is depressed from an outer surface of the first substrate towards an inner side of the first substrate;
   the second substrate faces the first substrate;
   the spacer is disposed between the first substrate and the second substrate; the spacer comprises a first end located in the recess, and a second end arranged on the second substrate; the first end and the second end are two opposite ends of the spacer;
   the spacer-supporting region further comprises a projection; the projection is located in the recess; the first end is located in the recess and abuts on the projection from a direction from the first substrate to the second substrate;
   the first substrate is a color filter substrate; the color filter substrate comprises a black matrix; the spacer-supporting region is located on the black matrix;
   the projection is directly located on the black matrix and located within the recess;
   a height of the projection relative to the black matrix is smaller than a depth of the recess relative to the black matrix;
   the color filter substrate further comprises a color film layer comprising N filter units, where N is an integral;
   the spacer-supporting region is formed of films which are used to form the N filter units; and
   the recess extends to the black matrix; the projection comprises films which are used to form N-n color filter units, where n is an integral, $1 \leq n < N$;
   wherein the spacer-supporting region is defined and enclosed by a red resin film, a green resin film and a blue resin film; the red resin film, the green resin film and the blue resin film are stacked on each other; the projection comprises a red resin film and a green resin film stacked on the red resin film;
   wherein the red resin film of the projection is separated from the red resin film which defines and encloses the spacer-supporting region; the green resin film of the projection is separated from the green resin film which defines and encloses the spacer-supporting region; and
   wherein the red resin film of the projection and the red resin film which defines and encloses the spacer-supporting region are in an identical layer.

6. The display device according to claim 5, wherein the first substrate comprises a plurality of spacer-supporting regions; the display device comprises a plurality of spacers; the spacers are corresponding to the spacer-supporting regions in a one to one manner.

7. The substrate according to claim 5, wherein the green resin film of the projection and the green resin film which defines and encloses the spacer-supporting region are in an identical layer.

* * * * *